United States Patent
Cheng et al.

(10) Patent No.: US 7,439,110 B2
(45) Date of Patent: Oct. 21, 2008

(54) STRAINED HOT (HYBRID ORIENTATION TECHNOLOGY) MOSFETS

(75) Inventors: Kangguo Cheng, Beacon, NY (US); Woo-Hyeong Lee, Poughquag, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 11/419,312

(22) Filed: May 19, 2006

(65) Prior Publication Data
US 2007/0269963 A1     Nov. 22, 2007

(51) Int. Cl.
*H01L 21/84* (2006.01)

(52) U.S. Cl. .......... 438/150; 257/64; 257/350; 257/E33.003; 257/627; 438/526

(58) Field of Classification Search ............. None
See application file for complete search history.

(56) References Cited

U.S. PATENT DOCUMENTS 7,119,400 B2 * 10/2006 Burden ............... 257/347
7,199,451 B2 * 4/2007 Kelman ............... 257/627
2007/0238233 A1 * 10/2007 Sadaka et al. ........... 438/187

* cited by examiner

*Primary Examiner*—Ha Nguyen
*Assistant Examiner*—Chakila Tillie
(74) *Attorney, Agent, or Firm*—Schmeiser, Olsen & Watts; Steven Capella (57) ABSTRACT

A strained HOT MOSFET fabrication method. The MOSFET fabrication method includes providing a semiconductor structure which includes (a) a first semiconductor layer having a first crystallographic orientation, (b) a buried insulating layer on top of the first semiconductor layer, (c) a second semiconductor layer on top of the buried oxide layer. The second semiconductor layer has a second crystallographic orientation different from the first crystallographic orientation. The method further includes forming a third semiconductor layer on top of the first semiconductor layer which has the first crystallographic orientation. The method further includes forming a fourth semiconductor layer on top of the third semiconductor layer. The fourth semiconductor layer (a) comprises a different material than that of the third semiconductor layer, and (b) has the first crystallographic orientation.

15 Claims, 14 Drawing Sheets

STRAINED HOT (HYBRID ORIENTATION TECHNOLOGY) MOSFETS

BACKGROUND OF THE INVENTION

1. Technical Field

The present invention relates to MOSFETs, and more particularly, to strained HOT (Hybrid Orientation Technology) MOSFETs.

2. Related Art

A conventional CMOS device comprises an N channel transistor and a P channel transistor formed on a same substrate. In order to make the device operate better, the N channel transistor is formed on a first crystallographic orientation semiconductor which is tensile strained, and the P channel transistor is formed on a second crystallographic orientation semiconductor which is compressively strained. Therefore, there is a need for a method for forming the CMOS device which is simpler than the prior art.

SUMMARY OF THE INVENTION

The present invention provides a semiconductor fabrication method, comprising providing a semiconductor structure which includes (a) a first semiconductor layer having a first crystallographic orientation, (b) a buried insulating layer on top of the first semiconductor layer, (c) a second semiconductor layer on top of the buried oxide layer, wherein the second semiconductor layer has a second crystallographic orientation, and wherein the second crystallographic orientation is different from the first crystallographic orientation; forming a third semiconductor layer on top of the first semiconductor layer, wherein the third semiconductor layer has the first crystallographic orientation; and forming a fourth semiconductor layer on top of the third semiconductor layer, wherein the fourth semiconductor layer comprises a different material than that of the third semiconductor layer, and wherein the fourth semiconductor layer has the first crystallographic orientation.

The present invention provides a semiconductor structure, comprising (a) a first semiconductor layer having a first crystallographic orientation; (b) a buried oxide layer on top of the first semiconductor layer; (c) a second semiconductor layer on top of the buried oxide layer, wherein the second semiconductor layer has a second crystallographic orientation, and wherein the second crystallographic orientation is different from the first crystallographic orientation; (d) a third semiconductor layer on top of the first semiconductor layer, wherein the third semiconductor layer has the first crystallographic orientation; and (e) a fourth semiconductor layer on top of the third semiconductor layer, wherein the fourth semiconductor layer comprises a different material than that of the third semiconductor layer, and wherein the fourth semiconductor layer has the first crystallographic orientation.

The present invention provides a semiconductor fabrication method, comprising providing a semiconductor structure which includes (a) a first semiconductor region having a first crystallographic orientation, (b) a second semiconductor region having a second crystallographic orientation, wherein the second crystallographic orientation is different from the first crystallographic orientation, and (c) an insulating region, wherein the first semiconductor region and the second semiconductor region are electrically insulated from each other by the insulating region; forming (i) a first sacrificial region on top of the first semiconductor region and (ii) a second sacrificial region on top of the second semiconductor region, wherein a first thickness of the first sacrificial region is less than a second thickness of the second sacrificial region; and etching the first and second sacrificial regions such that the first sacrificial region is completely removed but a portion of the second sacrificial region still remains on top of the second semiconductor region.

The present invention provides a method for forming a CMOS device which is simpler than the prior art.

DETAILED DESCRIPTION OF THE INVENTION

FIGS. 1-13 show a first fabrication process of a first semiconductor structure 100, in accordance with embodiments of the present invention.

Figure 1:
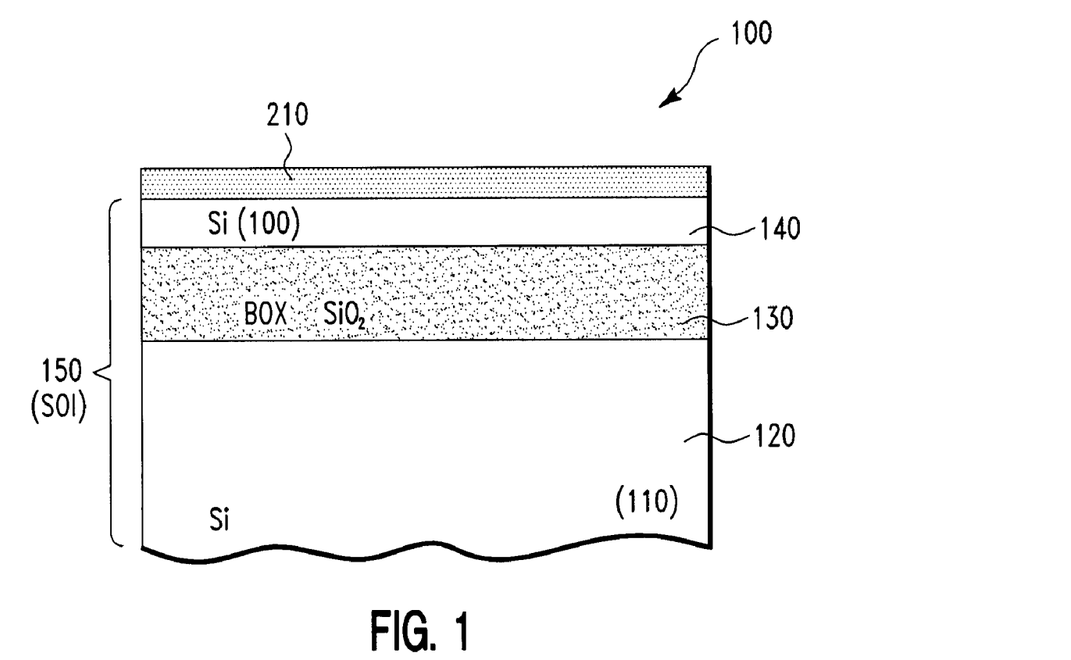
FIGS. 1-13 show a first fabrication process of a first semiconductor structure in accordance with embodiments of the present invention.

More specifically, with reference to FIG. 1, in one embodiment, the first fabrication process starts out with an SOI (silicon on insulator) substrate 150. In one embodiment, the SOI substrate 150 comprises a semiconductor substrate 120, a buried insulating layer such as a buried oxide (BOX) layer 130, and a silicon layer 140. Illustratively, the semiconductor substrate 120 comprises silicon and has a crystallographic surface orientation (110), the buried oxide layer 130 comprises silicon dioxide, and the silicon layer 140 has a crystallographic surface orientation (100). Alternatively, the semiconductor substrate 120 has a crystallographic surface orientation (100) and the silicon layer 140 has a crystallographic surface orientation (110). In one embodiment, the SOI substrate 150 is formed by a conventional method such as wafer bonding or SIMOX (Separation by IMplantation of Oxygen).

Next, in one embodiment, a pad layer 210 is formed on top of the silicon layer 140. Illustratively, the pad layer 210 comprises silicon nitride layer formed by CVD (Chemical Vapor Deposition) and an underlying silicon oxide layer (not shown) formed by thermal oxidation.

Figure 2:
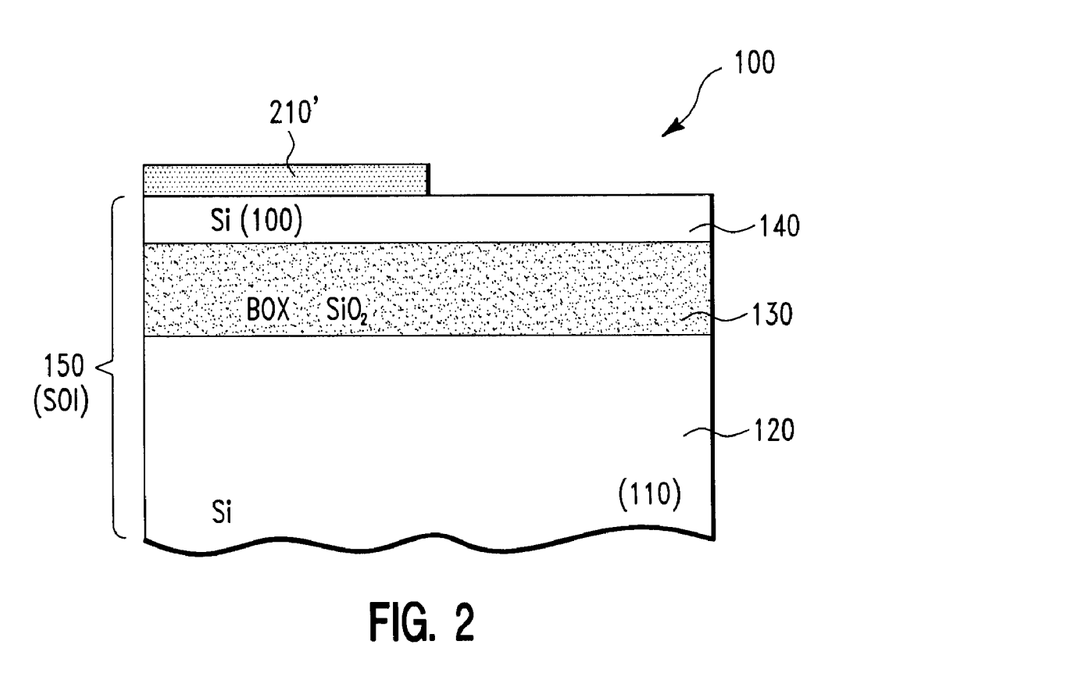

Next, in one embodiment, the pad layer 210 is patterned, resulting in a patterned pad region 210' as shown in FIG. 2. Illustratively, the patterned pad region 210' (FIG. 2) is formed by lithography and etching the pad layer 210.

Figure 3:
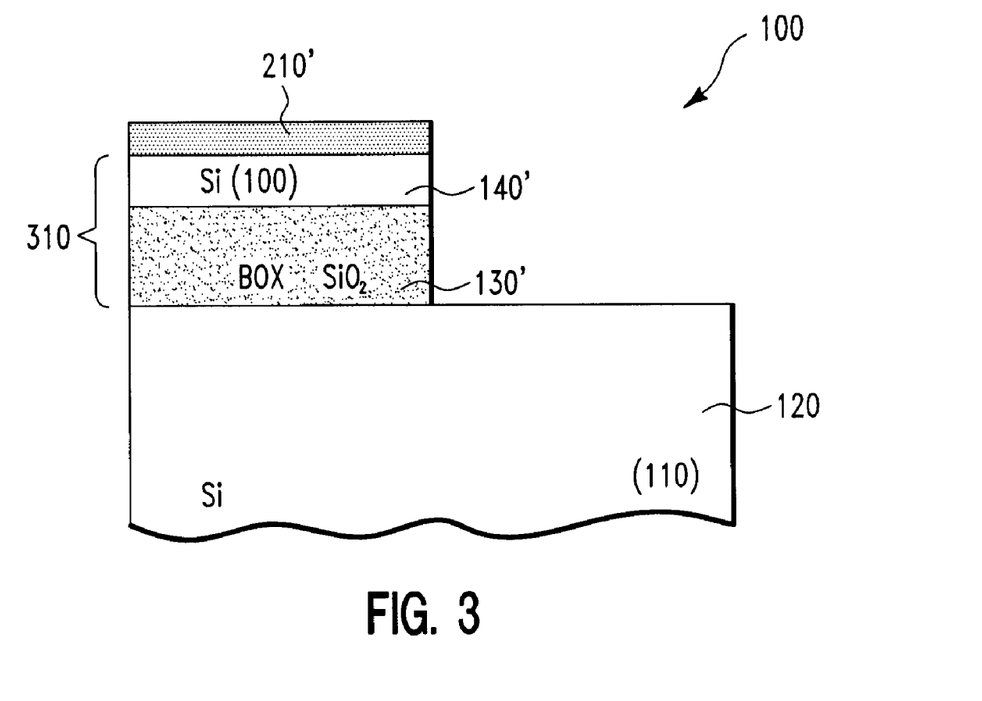

Next, with reference to FIG. 2, in one embodiment, the patterned pad region 210' is used as a mask for directionally etching the silicon layer 140, and the buried oxide layer 130, resulting in a silicon region 140', and a BOX region 130' (as shown in FIG. 3), respectively. Illustratively, etching the silicon layer 140 and the buried oxide layer 130 is performed by a RIE (Reactive Ion Etching) process. The patterned pad region 210', the silicon region 140', and the BOX region 130' can be collectively referred to as a block 310, as shown in FIG. 3.

Figure 4:
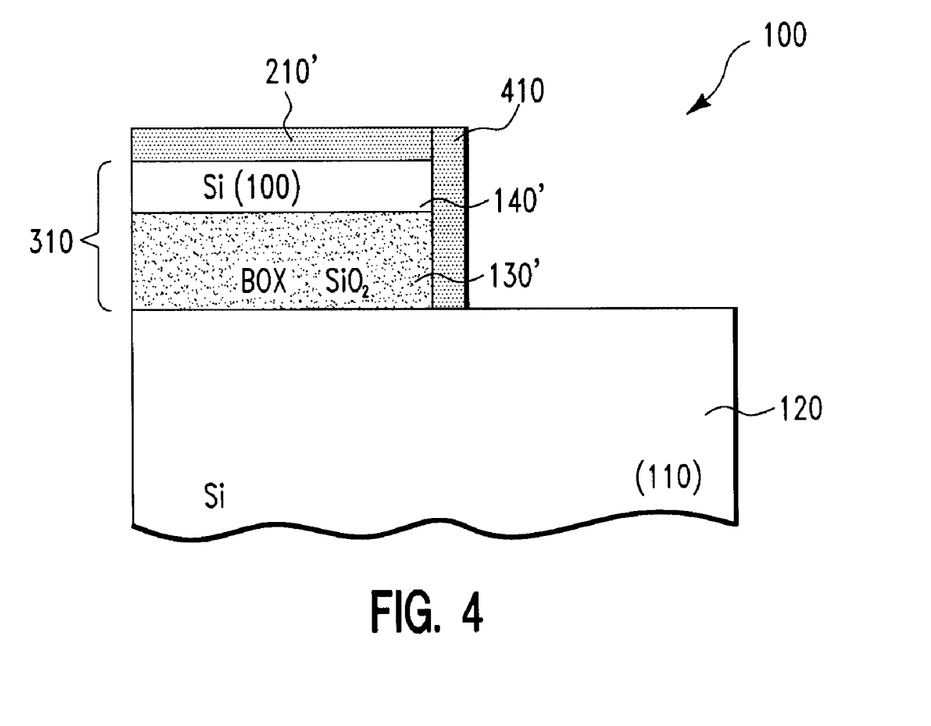

Next, with reference to FIG. 4, in one embodiment, a spacer 410 is formed on a sidewall of the block 310. The spacer 410 may comprise silicon oxide or silicon nitride formed by (i) CVD of a layer of spacer material (not shown) everywhere on top of the structure 100 (including on the sidewall of the block 310) of FIG. 3, and then (ii) directionally etching back the deposited spacer material (not shown), resulting in the spacer 410.

Figure 5:
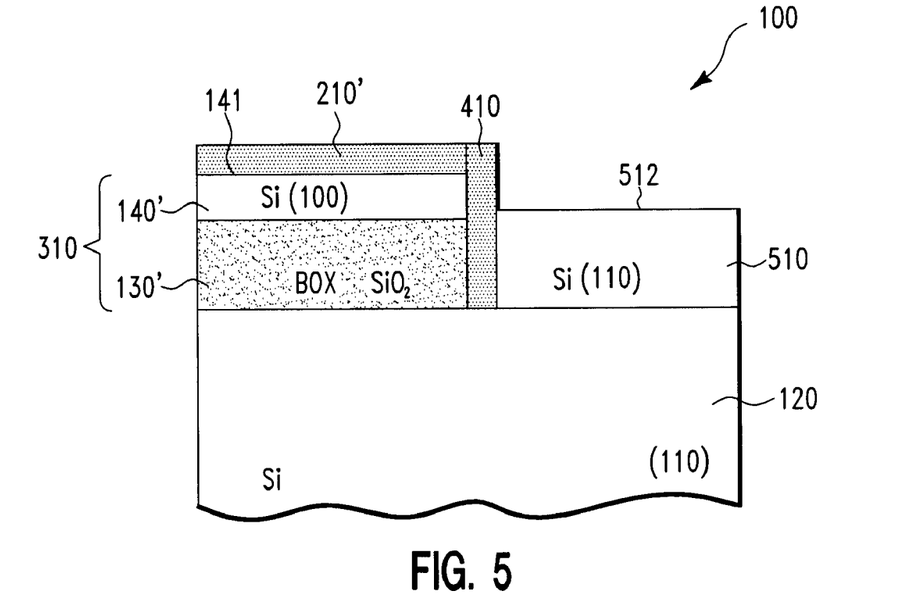

Next, with reference to FIG. 5, in one embodiment, an optional silicon region 510 is formed on top of the semiconductor substrate 120. Illustratively, the silicon region 510 is formed by epitaxially growing silicon on the semiconductor substrate 120, resulting in the silicon region 510 having the same crystallographic orientation as the semiconductor substrate 120, i.e., (110). In one embodiment, the silicon region 510 is grown such that its top surface 512 is lower than the top surface 141 of the silicon region 140'. In an alternative embodiment, the silicon region 510 is grown such that its top surface is higher than the top surface 141 of the silicon region 140' and the silicon region 510 is recessed, resulting in its top surface 512 being lower than the top surface 141 of the silicon region 140'.

Figure 6:
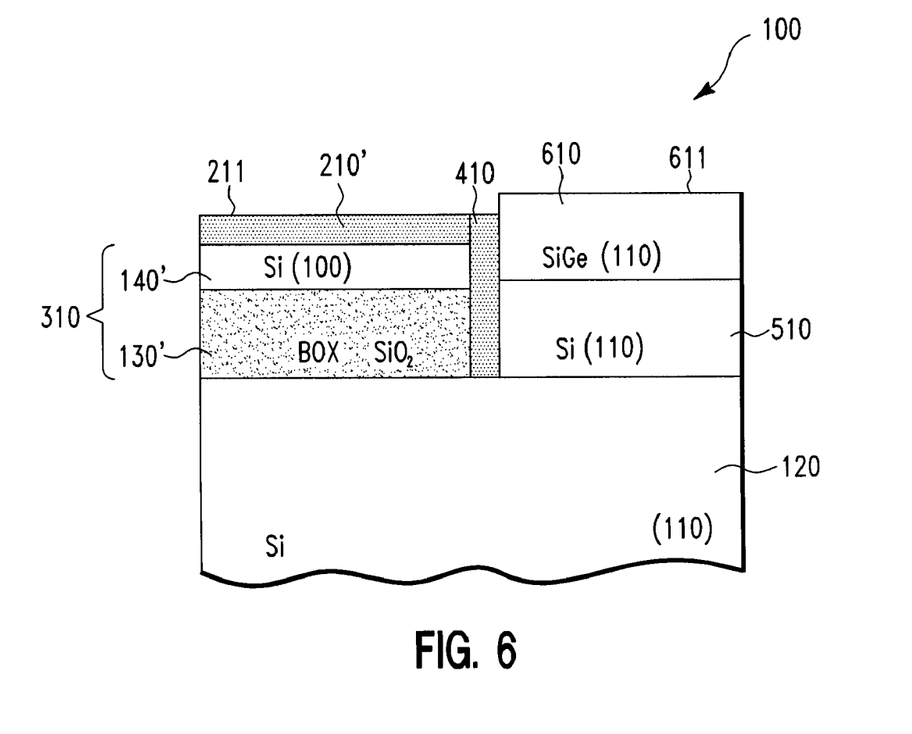

Next, with reference to FIG. 6, in one embodiment, a region 610 comprising a material different from the silicon region 510 is formed on top of the silicon region 510. Illustratively, the region 610 comprises SiGe (a mixture of silicon and germanium). The atomic ratio between germanium (Ge) and silicon (Si) in the region 610 may preferably range from 1:99 to 99:1, more preferably from 1:4 to 4:1, and most preferably from 1:2 to 2:1. In one embodiment, the atomic ratio between germanium and silicon in the region 610 is 2:3. In another embodiment, the region 610 comprises germanium (Ge). Alternatively, the region 610 comprises SiC (a mixture of silicon and carbon). The atomic ratio between carbon (C) and silicon (Si) in the region 610 may preferably range from 0.01:99.99 to 10:90, more preferably from 0.1:99.9 to 5:95, and most preferably from 0.5:99.5 to 2:98. In one embodiment, the atomic ratio between carbon and silicon in the region 610 is 1:99. In one embodiment, the region 610 is formed by epitaxial growth on the silicon region 510 (but not on top of the patterned pad region 210' and the spacer 410), resulting in the region 610 having a same crystallographic orientation (110) as the silicon region 510. In one embodiment, the region 610 is over grown such that a top surface 611 of the region 610 is at a higher level than a top surface 211 of the patterned pad region 210'.

The region 510 and 610 may be grown using any suitable technique, including but not limited to, ultrahigh vacuum chemical vapor deposition (UHVCVD) may be used. Other conventional techniques include rapid thermal chemical vapor deposition (RTCVD), Metalorganic Chemical Vapor Deposition (MOCVD), low-pressure chemical vapor deposition (LPCVD), limited reaction processing CVD (LRPCVD), molecular beam epitaxy (MBE), etc.

Figure 7:
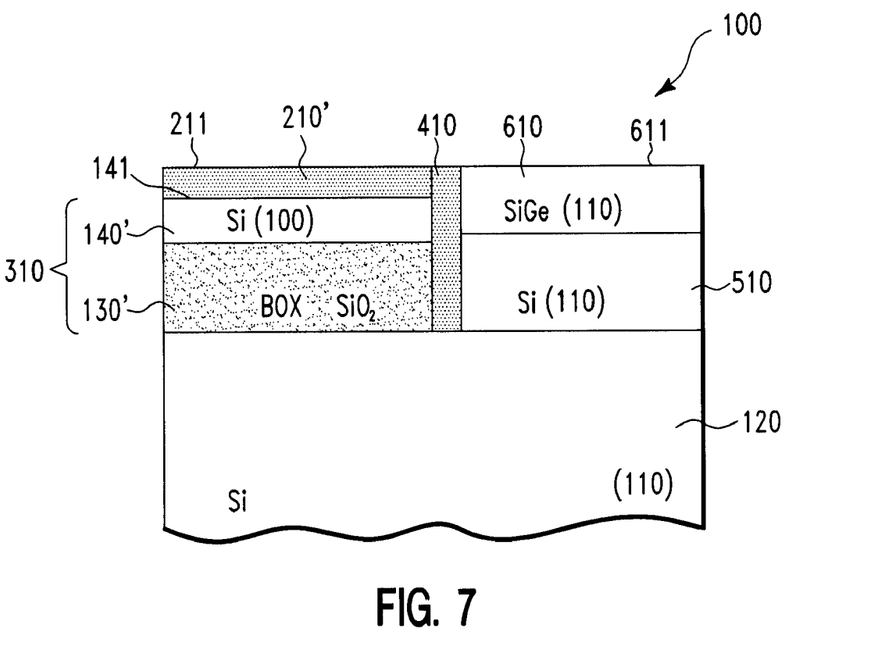

Next, in one embodiment, a planarization process such as CMP (Chemical Mechanical Polishing) process is performed on the structure 100 of FIG. 6 so as to make the top surface 611 of the region 610 coplanar with the top surface 211 of the patterned pad region 210' as shown in FIG. 7.

Figure 8:
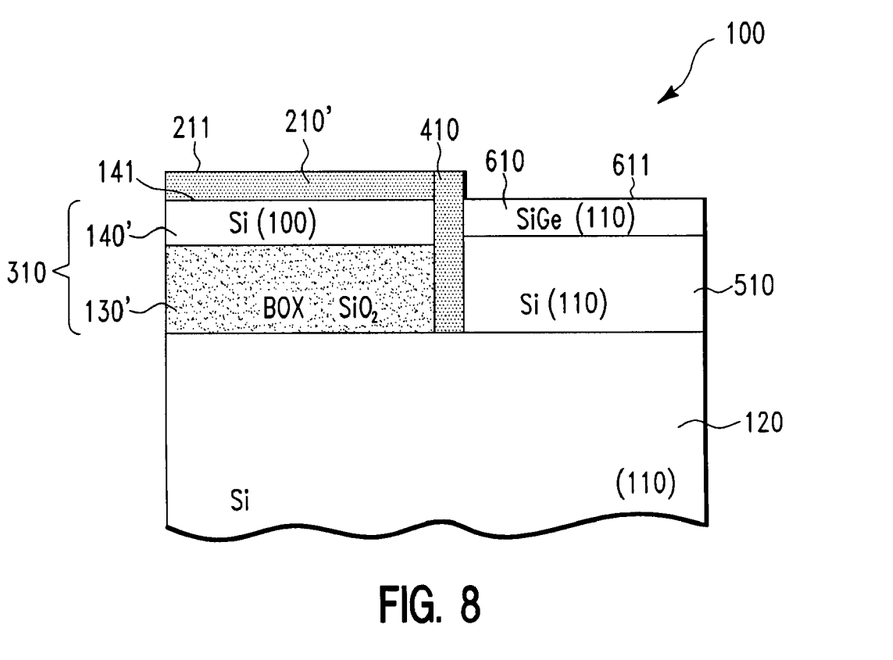

Next, with reference to FIG. 7, in one embodiment, the region 610 is recessed so as to make the top surface 611 of the region 610 coplanar with the top surface 141 of the silicon region 140', as shown in FIG. 8. Illustratively, the region 610 is recessed by a RIE process. Alternatively, the region 610 is recessed by converting a portion of the region 610 into an oxide (not shown) by thermal oxidation and then removing the oxide.

Figure 9:
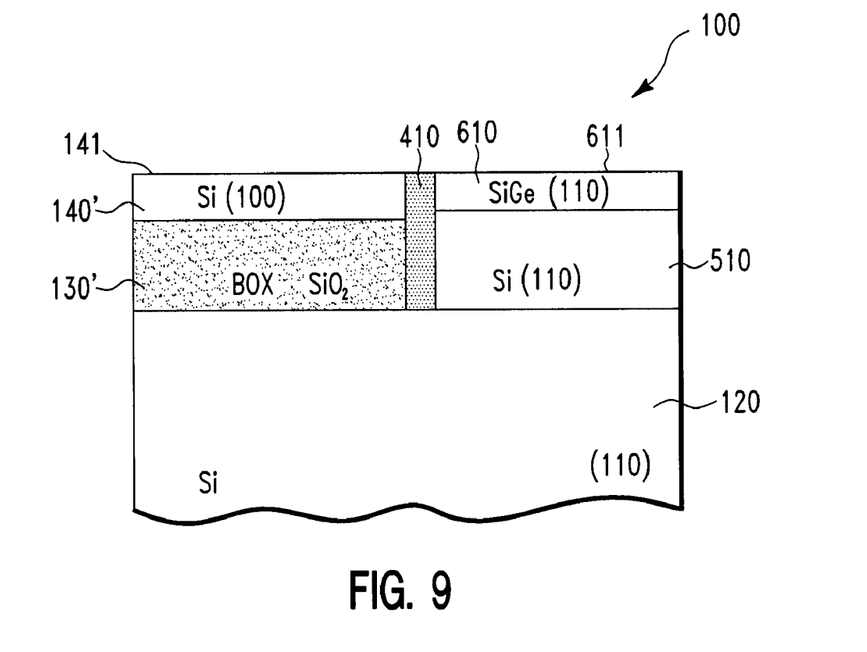

Next, with reference to FIG. 8, in one embodiment, the pad layer 210' and a portion of the spacer 410 are removed such that the top surface 141 of the silicon region 140' is exposed to the surrounding ambient, resulting in structure 100 of FIG. 9. The pad layer 210' can be removed by any suitable conventional process.

Figure 10:
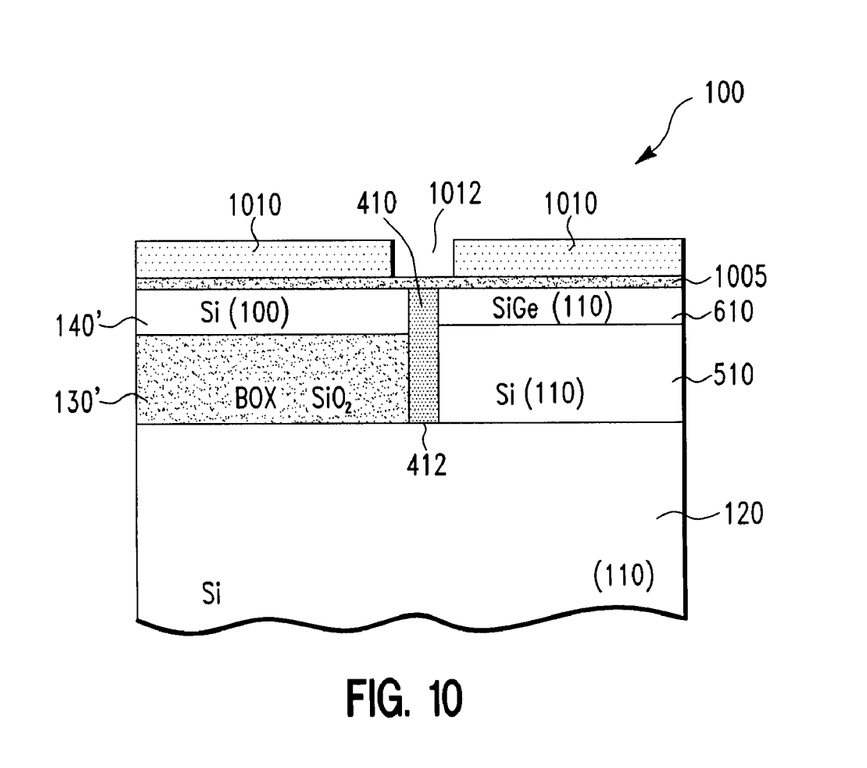
Figure 12:
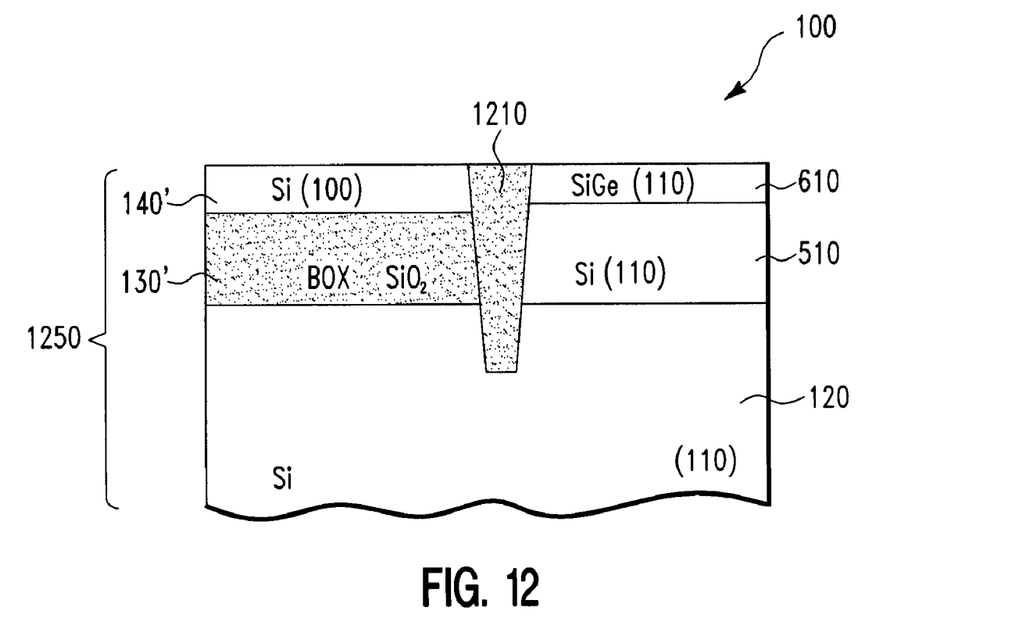

Next, with reference to FIG. 10 and FIG. 12, in one embodiment, the entire or a portion of the spacer 410 (FIG. 10) is removed and an STI (shallow trench isolation) region 1210 (FIG. 12) is formed by conventional patterning, trench etching, and trench fill processes. In one embodiment, the bottom 1011 of the STI is lower than a top surface 122 of the semiconductor substrate 120. Illustratively, the STI region 1210 comprises silicon dioxide.

Figure 11:
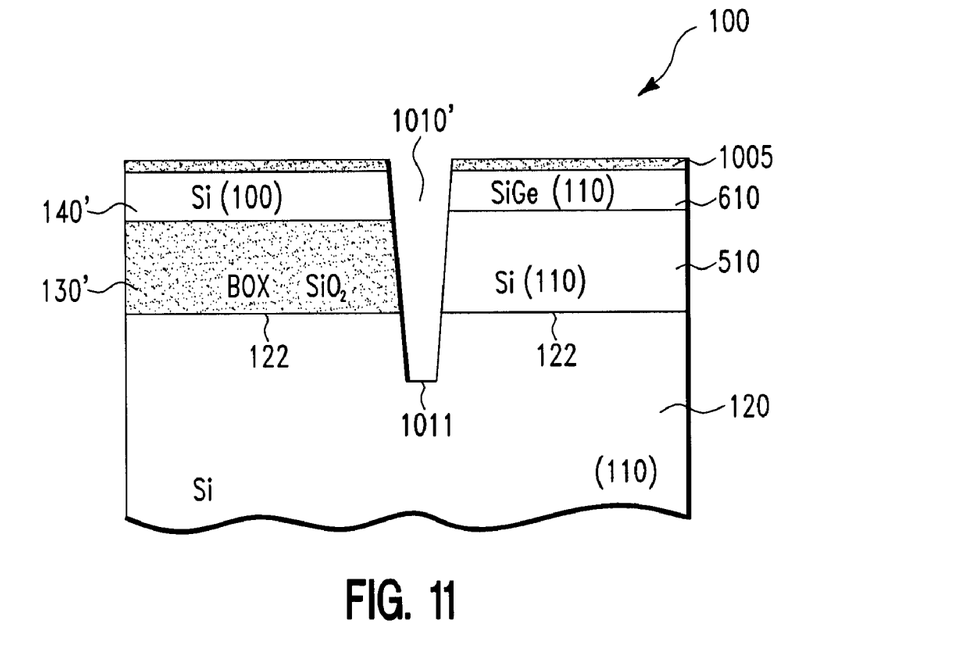

In one embodiment, the transition from FIG. 10 to FIG. 12 is shown in FIGS. 10 and 11. More specifically, with reference to FIG. 10, a hard mask layer 1005 is formed on top of the structure 100 of FIG. 9. Next, in one embodiment, a patterned photo resist layer 1010 is formed on top of the pad layer. Illustratively, the patterned photo resist layer 1010 is formed by a lithography process such that there is an opening 1012 directly above the nitride spacer 410. Next, in one embodiment, the patterned photo resist layer 1010 is used as a mask to pattern the hard mask layer 1005. Next, the patterned photo resist layer 1010 is removed and then the patterned hard mask layer 1005 is used as a mask to etch and remove the region that is directly beneath the opening 1012, resulting in a trench 1010' as shown in FIG. 11. It should be noted that this etching also removed the nitride spacer 410.

It should be noted that, with reference to FIG. 12, the substrate 1250 can be referred to as a HOT (Hybrid Orientation Technology) substrate 1250 because it has two semiconductor regions having different crystallographic orientations. Furthermore, the region 410' and the region 610 comprise different semiconductor materials. In addition, the region 610 is strained due to the lattice mismatch between the material in the region 610 and the material underlying the region 610. Illustratively, the region 140' comprises silicon and has the crystallographic orientation (100) while the region 610 comprises SiGe and has the crystallographic orientation (110). The region 610 has a compressive stress because of the lattice mismatch between SiGe in the region 610 and silicon in the underlying region 510. Alternatively, the region 140' comprises silicon and has the crystallographic orientation (110) while the region 610 comprises SiC and has the crystallographic orientation (100). The region 610 has a tensile stress because of the lattice mismatch between SiC in the region 610 and silicon in the underlying region 510.

Figure 13:
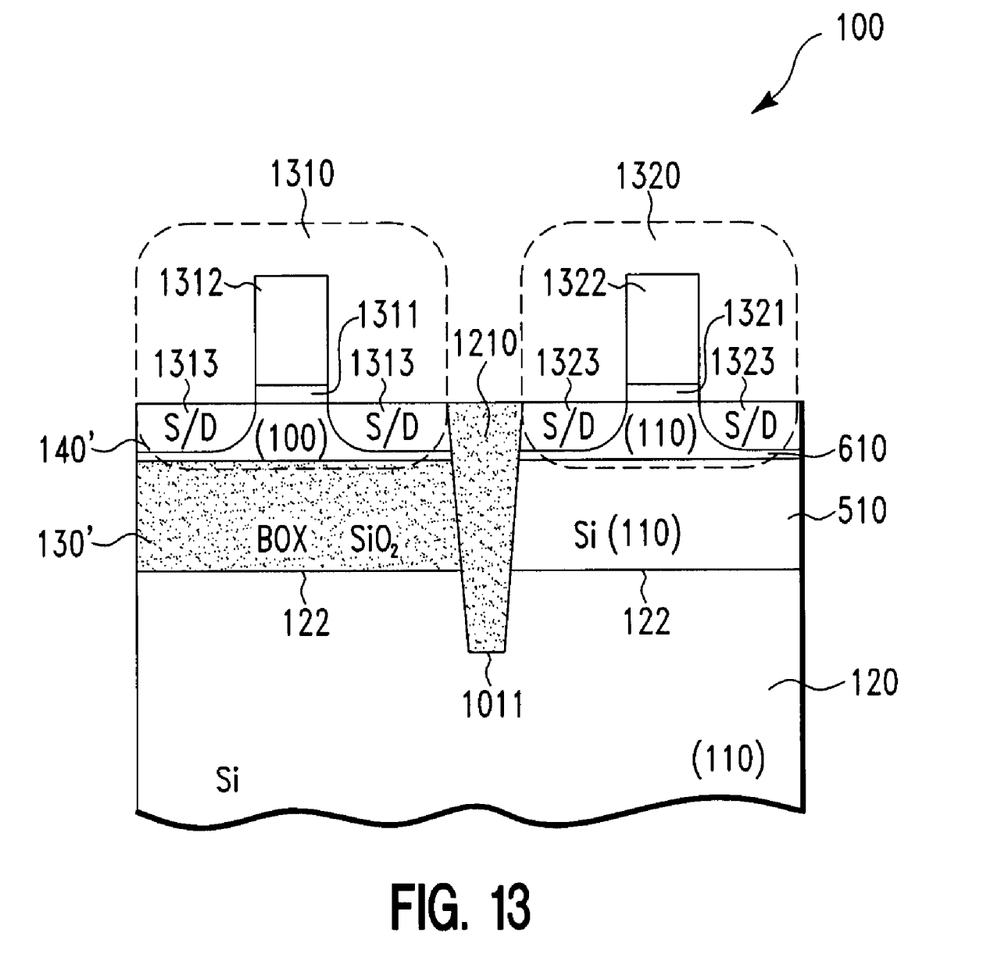

Next, with reference to FIG. 13, in one embodiment, an N channel transistor 1310 is formed on the (100) silicon region 140' and a P channel transistor 1320 is formed on the (110) epi region 610 by a conventional method. Illustratively, the N channel transistor 1310 comprises a gate dielectric layer 1311, a gate electrode 1312, and source/drain regions 1313, and the P channel transistor 1320 comprises a gate dielectric layer 1321, a gate electrode 1322, and source/drain regions 1323.

It should be noted that, as illustrated in FIG. 13, because the N channel transistor 1310 is formed on the (100) silicon region 140' and the P channel transistor 1320 is formed on the (110) region 610, the performances of both N channel transistor 1310 and the P channel transistor 1320 are optimized. Moreover, the semiconductor region 610 is compressively strained because it comprises SiGe formed on the semiconductor region 510 which comprises silicon. The performance of the P channel transistor 1320 is further improved by due to the compressive strained in the region 610. Finally, since the carrier mobility is higher in SiGe than silicon, forming the P channel transistor 1320 on the SiGe region 610 provides further performance enhancement in comparison with forming a P channel transistor formed on a silicon region.

In the embodiments described above, the region 610 comprises SiGe or SiC. Alternatively, the region 610 can comprise only germanium.

In an alternative embodiment shown in FIG. 13, the region 140' comprises silicon and has the crystallographic orientation (110) while the region 610 comprises SiC and has the crystallographic orientation (100). The region 610 is tensily strained because of the lattice mismatch between SiC in the region 610 and silicon in the underlying region 510. A P-channel transistor is formed in the silicon region 140' which has a crystallographic orientation (110) and an N-channel transistor is formed in the tensily strained SiC region 610. The performance of the P-channel transistor is enhanced by forming it on the (110). Meanwhile, the performance of the N-channel transistor is enhanced on the (1) tensily strained, (2) (100) region, and (3) SiC region.

FIGS. 14-25 show a second fabrication process of a second semiconductor structure 200, in accordance with embodiments of the present invention.

Figure 14:
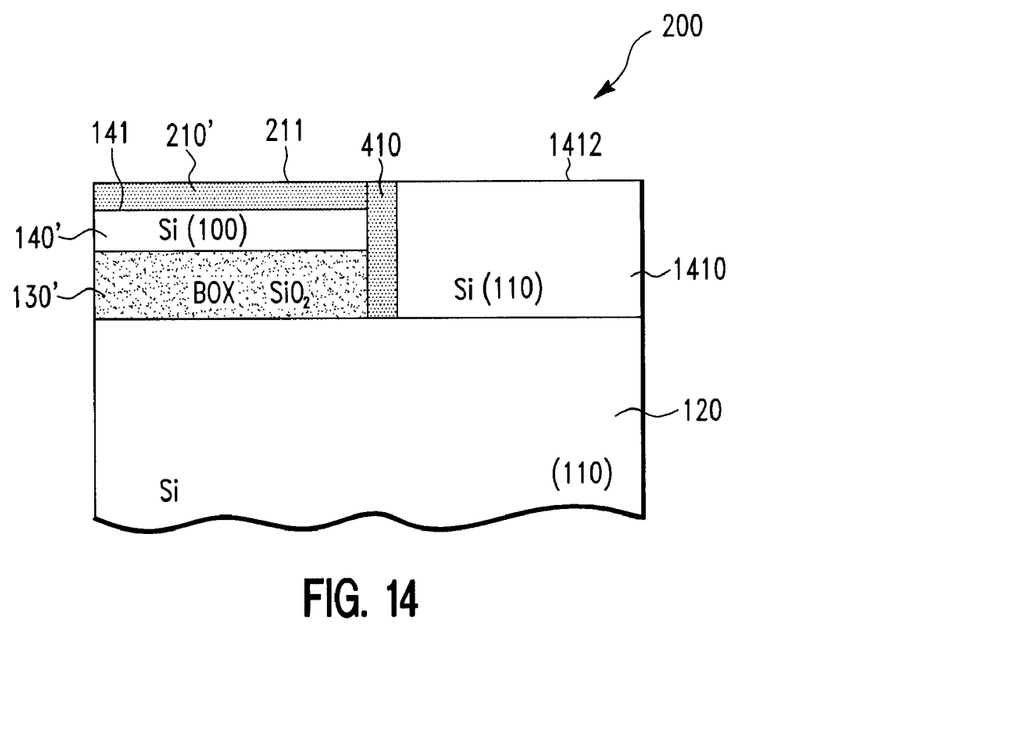
FIGS. 14-25 show a second fabrication process of a second semiconductor structure in accordance with embodiments of the present invention.

More specifically, with reference to FIG. 14, in one embodiment, the second fabrication process starts out with the structure 200 of FIG. 14. Illustratively, the structure 200 of FIG. 14 is similar to structure 100 of FIG. 5 except that the top surface 1412 of region 1410 is coplanar with the top surface 212 of the region 210'. It should be noted that the similar regions of the two structures 200 of FIG. 14 and 100 of FIG. 5 have the same reference numerals. In one embodiment, the formation of the structure 200 of FIG. 14 is similar to the formation of the structure 100 of FIG. 5 except that an silicon region 1410 is epitaxially grown and planarized such that a top surface 1412 of the silicon region 1410 is coplanar with the top surface 212 of the patterned pad region 210'.

Figure 15:
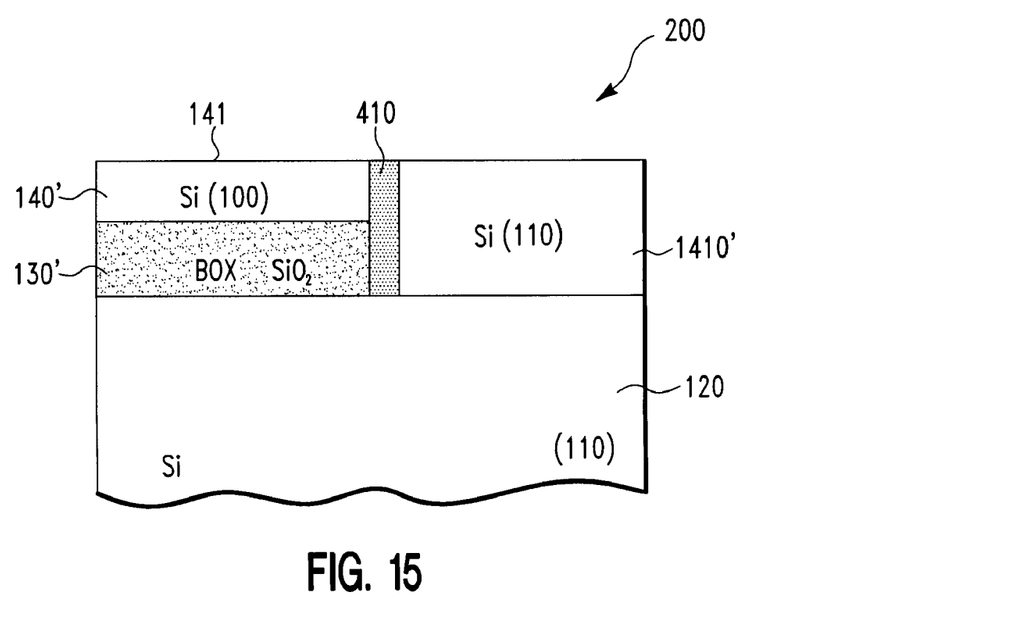

Next, in one embodiment, a process similar to the process of transforming the structure 100 of FIG. 7 to the structure 100 of FIG. 9 is performed on structure 200 of FIG. 14, resulting in the structure 200 of FIG. 15. More specifically, the region 1410 is recessed and then the region 210' and a top portion of the spacer 410 are removed, resulting in structure 200 of FIG. 15. It should be noted that what remains of the region 1410 (FIG. 14) after said removal is a silicon region 1410'.

Figure 16:
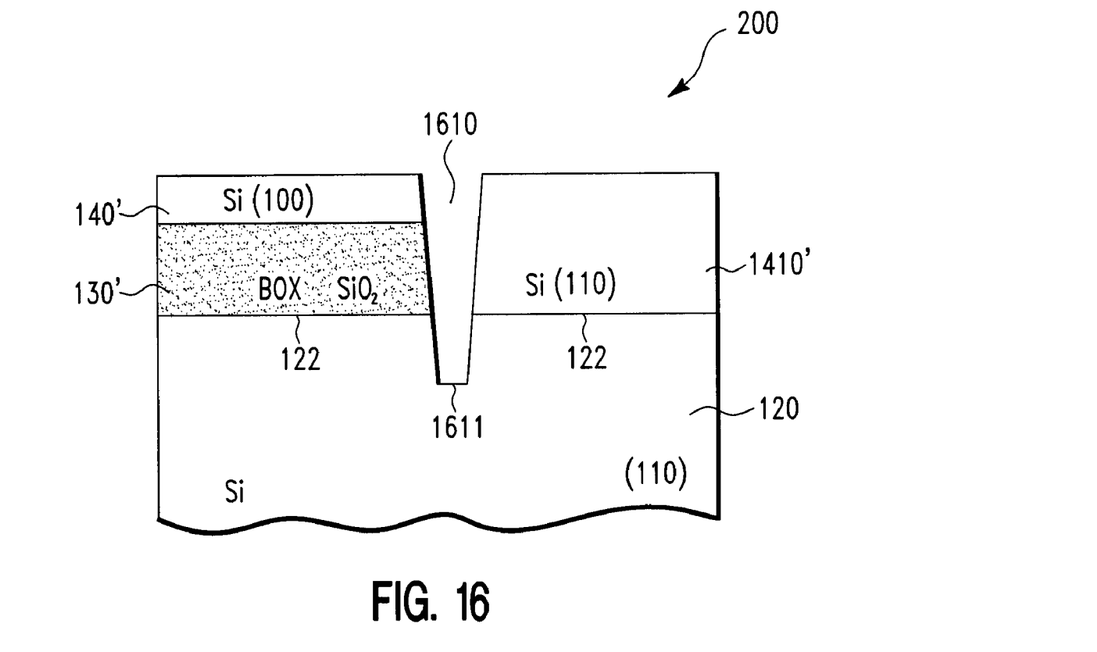
Figure 17:
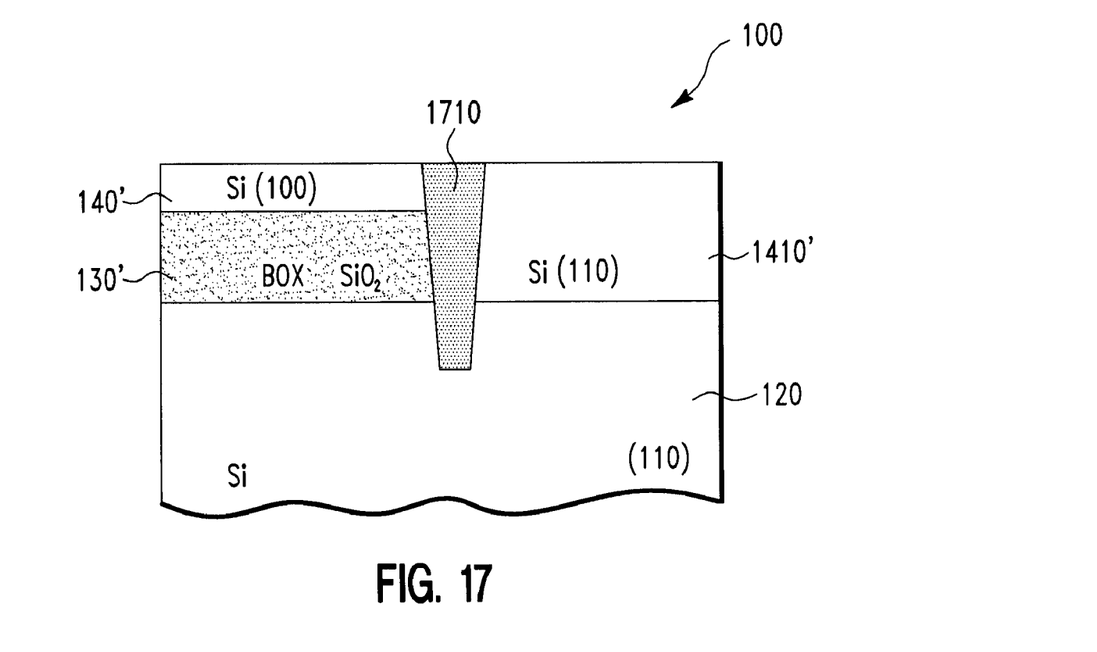

Next, in one embodiment, a process similar to the process of transforming the structure 100 of FIG. 9 to the structure 100 of FIG. 12 is performed on structure 200 of FIG. 15, resulting in the structure 200 of FIG. 16, and then FIG. 17.

Figure 18:
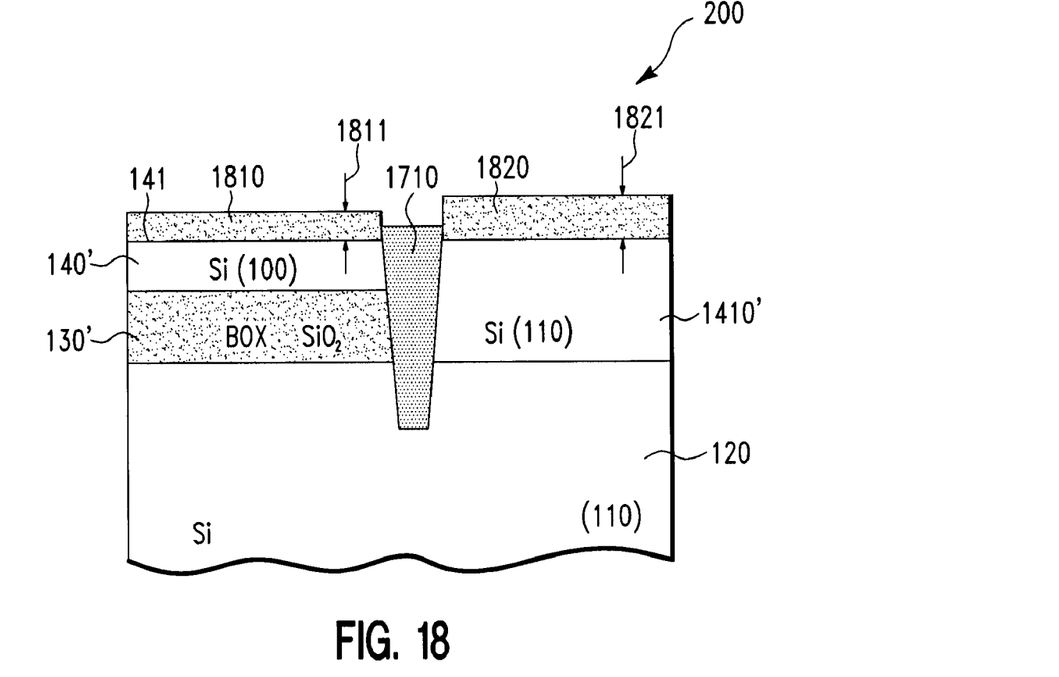

Next, with reference to FIG. 18, in one embodiment, silicon dioxide regions 1810 and 1820 are formed on top of the silicon region 140' and the silicon region 1410', respectively. Illustratively, the silicon dioxide regions 1810 and 1820 are formed by thermal oxidation of silicon at top of the silicon region 140' and the silicon region 1410', respectively. It should be noted that the silicon region 140' has the crystallographic orientation (100) and the silicon region 1410' has the crystallographic orientation (110). Therefore the oxidation rate of silicon on the silicon region 140' is slower than the oxidation rate of silicon on the silicon region 1410'. As a result, a thickness 1821 of the silicon dioxide regions 1820 is greater than a thickness 1811 of the silicon regions 1810, as shown in FIG. 18.

Figure 19:
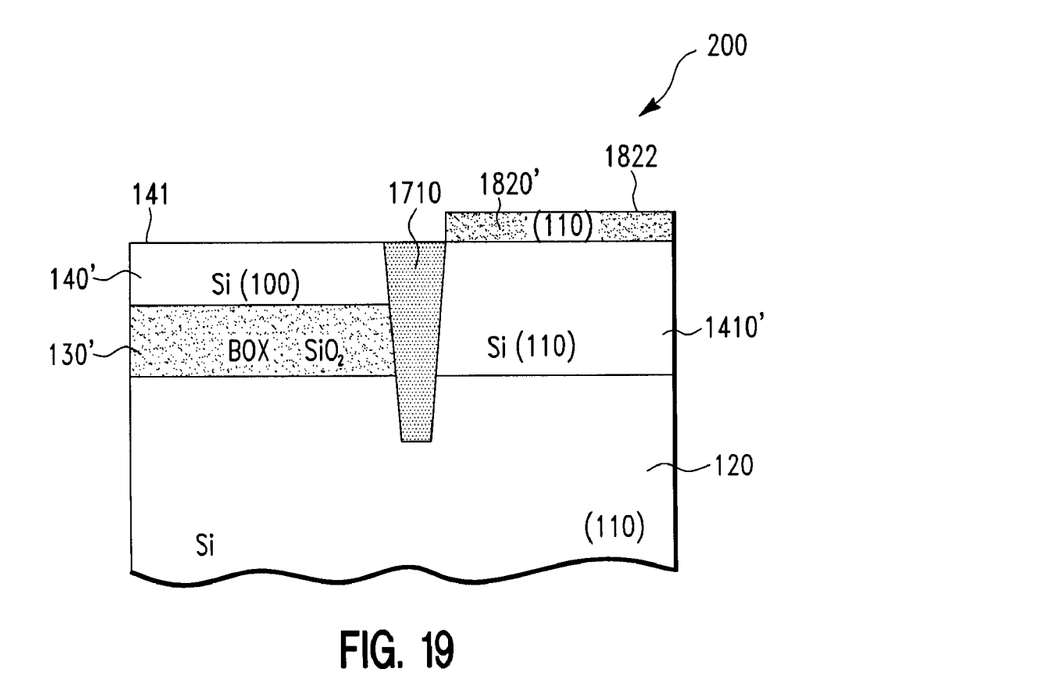

Next, in one embodiment, the silicon dioxide regions 1810 and 1820 are etched such that the silicon dioxide region 1810 is completely removed, and a portion 1820' (FIG. 19) of the silicon dioxide region 1820 still remains (because the thickness 1821 of the silicon dioxide regions 1820 is greater than the thickness 1811 of the silicon regions 1810 (FIG. 18)). The portion 1820' of the silicon region 1820 is referred to as a silicon region 1820', as shown in FIG. 19. In one embodiment, etching the silicon dioxide regions is performed by a timed wet etching process with an etchant containing hydrofluoric acid or a dry etching process such as a plasma etch or RIE (reactive ion etch).

Figure 20:
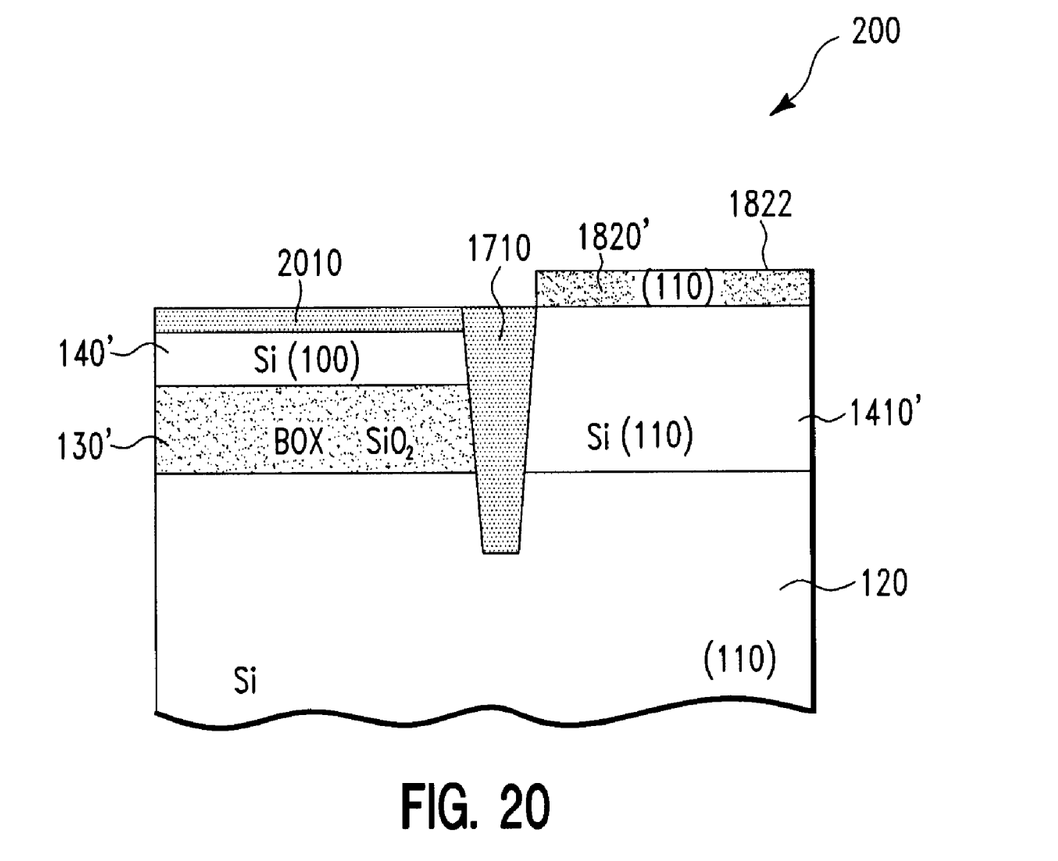

Next, with reference to FIG. 20, in one embodiment, a silicon nitride region 2010 is formed in the silicon region 140'. Illustratively, the silicon nitride region 2010 is formed by thermal nitridation of silicon of the silicon region 140' in an environment having at least one nitrogen species such as ammonium. Since the region 1410' is covered by the silicon dioxide region 1820, no silicon nitride is formed in this region.

Figure 21:
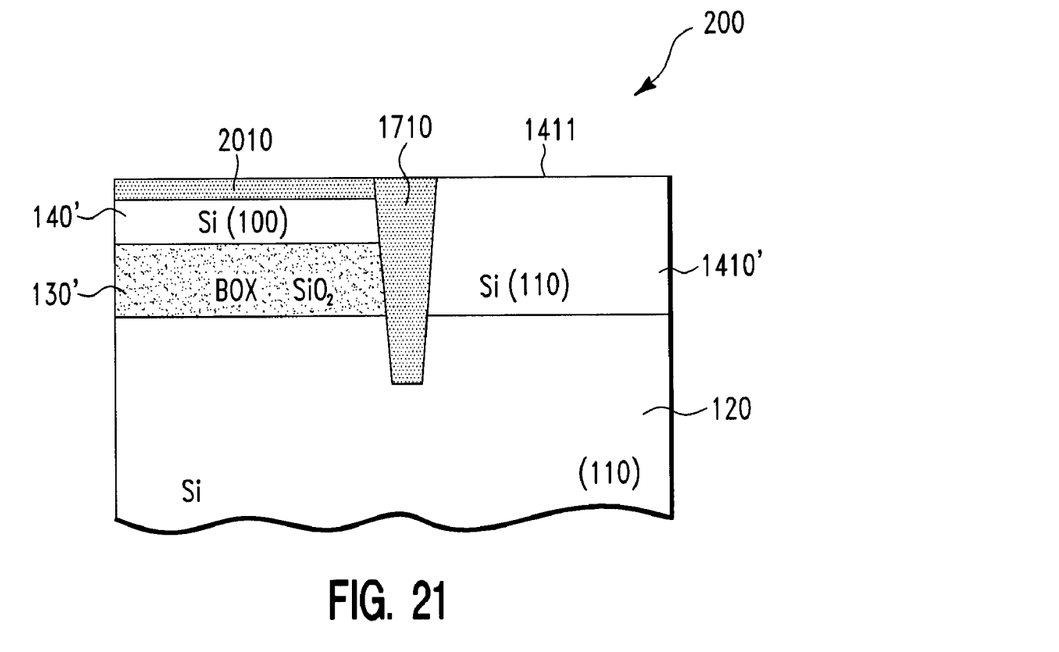

Next, in one embodiment, the silicon regions 1820' is removed by a conventional etch process such as a wet etching process or a dry etching process, until a top surface 1411 of the silicon region 1410' is exposed to the surrounding ambient, resulting in structure 100 of FIG. 21.

Figure 22:
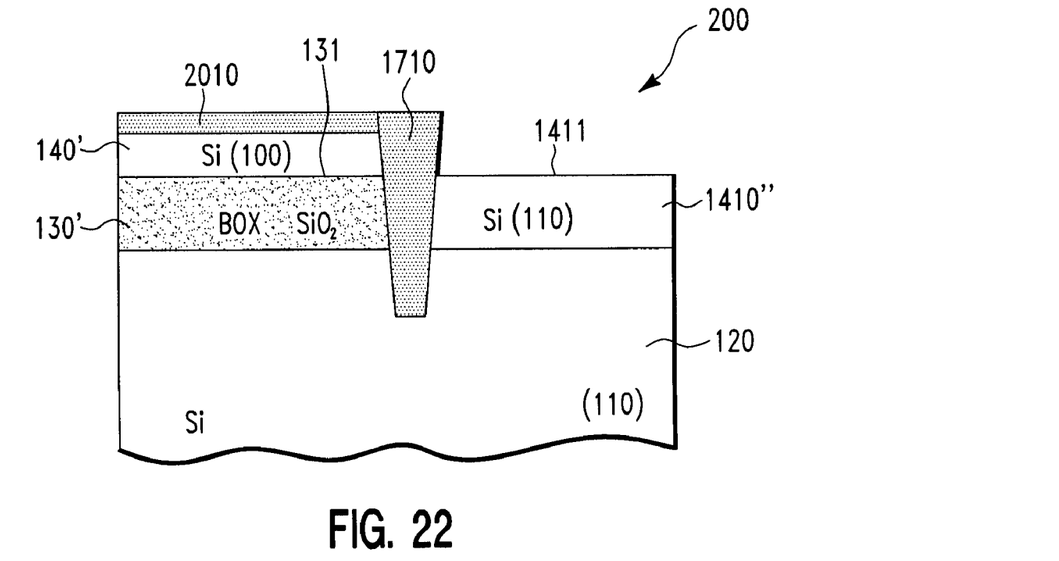

Next, with reference to FIG. 21, in one embodiment, the silicon region 1410' is recessed until the top surface 1411 (FIG. 22) of the silicon region 1410' is coplanar with the top surface 131 of the BOX region 130', resulting in an silicon region 1410'', as shown in FIG. 22. The region 140' is protected by the silicon nitride layer 2010 during the recess process.

Figure 23:
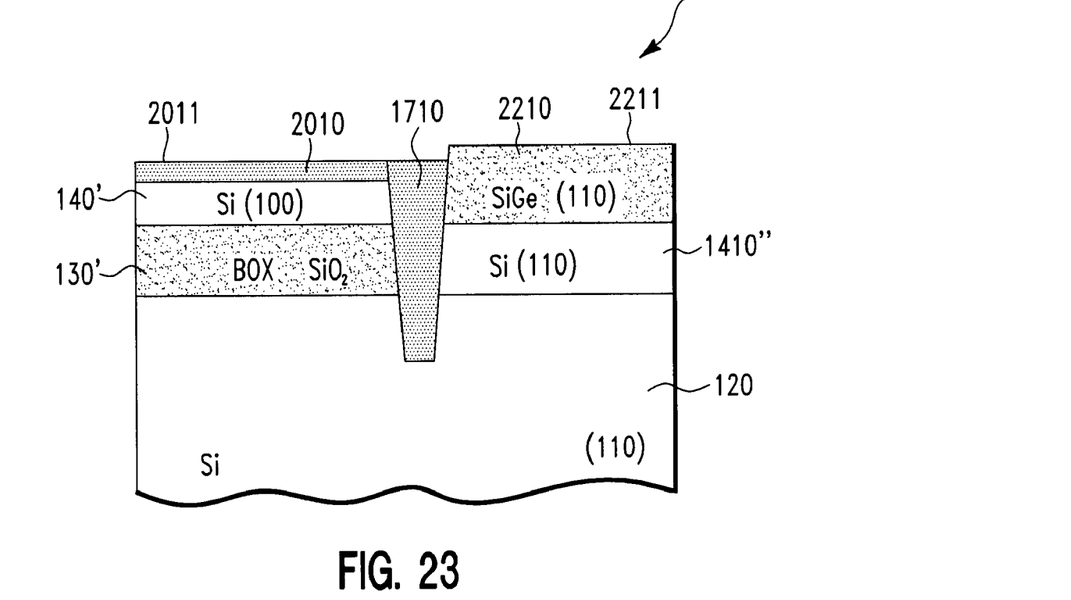

Next, with reference to FIG. 23, in one embodiment, an epi region 2210 is formed on top of the silicon region 1410''. Illustratively, the region 2210 comprises SiGe. In one embodiment, the region 2210 is formed by epitaxial growth of SiGe on top of the silicon region 1410''. In one embodiment, the region 2210 is over grown such that a top surface 2211 of the region 2210 is at a higher level than a top surface 2011 of the silicon nitride region 2010.

Figure 24:
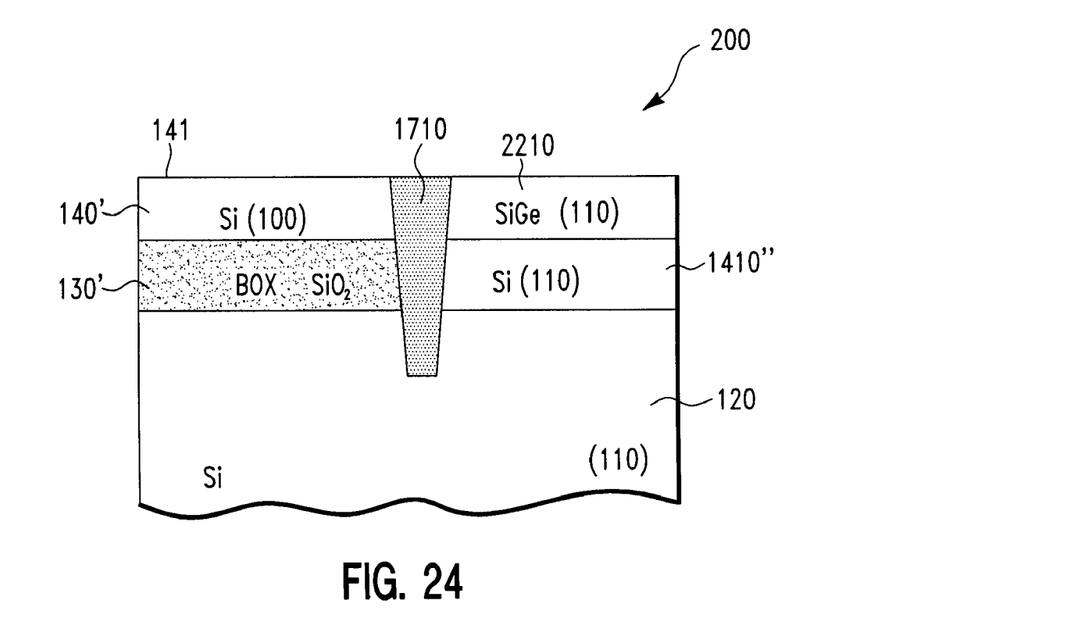

Next, in one embodiment, a process similar to the process of transforming the structure 100 of FIG. 6 to the structure 100 of FIG. 9 is performed on structure 200 of FIG. 23, resulting in the structure 200 of FIG. 24.

Figure 25:
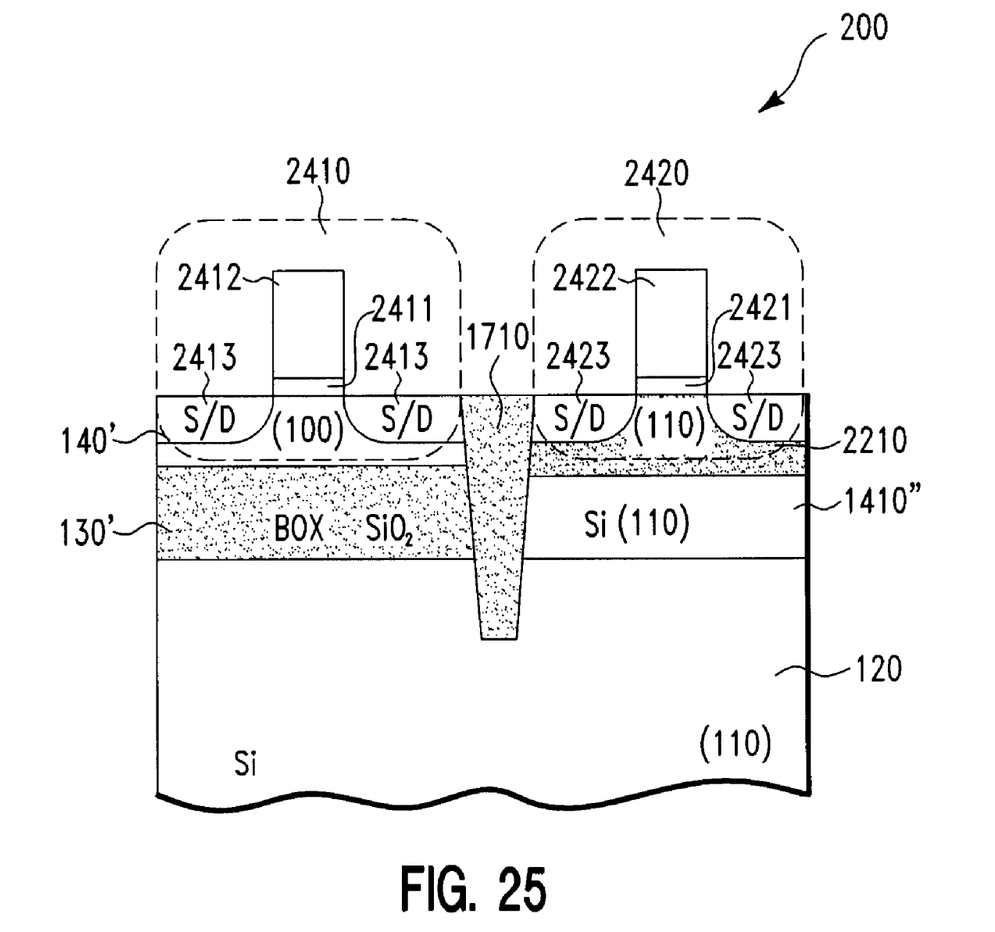

Next, with reference to FIG. 25, the structure 200 of FIG. 25 is similar to the structure 100 of FIG. 13; therefore it has the same characteristic. Illustratively, an N channel transistor 2410 is formed on the silicon region 140' which has the crystallographic orientation (100) and a P channel transistor 2420 is formed on the region 2210 which has the crystallographic orientation (110) by a conventional method. Illustratively, the N channel transistor 2410 comprises a gate dielectric layer 2411, a gate electrode 2412, and source/drain regions 2413, and the P channel transistor 2420 comprises a gate dielectric layer 2421, a gate electrode 2422, and source/drain regions 2423. In the embodiments described above, the region 2210 comprises SiGe. Alternatively, the region 2210 can comprise only germanium.

In the embodiments of the second semiconductors 200 described above, the region 140' comprises silicon and has the crystallographic orientation (100) while the region 2210 comprises SiGe and has the crystallographic orientation (110). Alternatively, the region 140' comprises silicon and has the crystallographic orientation (110) while the region 2210 comprises SiC and has the crystallographic orientation (100). The atomic ratio between carbon (C) and silicon (Si) in the region 2210 may preferably range from 0.01:99.99 to 10:90, more preferably from 0.1:99.9 to 5:95, and most preferably from 0.5:99.5 to 2:98. In one embodiment, the atomic ratio between carbon and silicon in the region 2210 is 1:99.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:
   providing a semiconductor structure which includes:
   (a) a first semiconductor layer having a first crystallographic orientation, (b) a buried insulating layer on top of the first semiconductor layer, (c) a second semiconductor layer on top of the buried oxide layer, wherein the second semiconductor layer has a second crystallographic orientation, and wherein the second crystallographic orientation is different from the first crystallographic orientation;

forming a third semiconductor layer on top of the first semiconductor layer, wherein the third semiconductor layer has the first crystallographic orientation; and forming a fourth semiconductor layer on top of the third semiconductor layer, wherein the fourth semiconductor layer comprises a different material than that of the third semiconductor layer, and wherein the fourth semiconductor layer has the first crystallographic orientation.

2. The method of claim 1, wherein the first, second, and third semiconductor layers comprise silicon, and wherein the fourth semiconductor layer comprises a mixture of Si and Ge.

3. The method of claim 1, wherein the first, second, and third semiconductor layers comprise silicon, and wherein the fourth semiconductor layer comprises a mixture of Si and C.

4. The method of claim 1, wherein the buried insulating layer comprises silicon dioxide.

5. The method of claim 1, wherein the first crystallographic orientation is (110), and wherein the second crystallographic orientation is (100).

6. The method of claim 5, further comprising forming an N-channel transistor and a P-channel transistor on the second and fourth semiconductor layers, respectively.

7. The method of claim 1, wherein said forming the third semiconductor layer comprises epitaxially growing a semiconductor material on the first semiconductor layer.

8. The method of claim 1, wherein said forming the fourth semiconductor layer comprises epitaxially growing a semiconductor material on the third semiconductor layer.

9. A semiconductor fabrication method, comprising:
providing a semiconductor structure which includes:
(a) a first semiconductor region having a first crystallographic orientation,
(b) a second semiconductor region having a second crystallographic orientation, wherein the second crystallographic orientation is different from the first crystallographic orientation, and
(c) an insulating region, wherein the first semiconductor region and the second semiconductor region are electrically insulated from each other by the insulating region;

forming (i) a first sacrificial region on top of the first semiconductor region and (ii) a second sacrificial region on top of the second semiconductor region, wherein the first crystallographic orientation and the second crystallographic orientation cause the first sacrificial region to be less than a second thickness of the second sacrificial region; and etching the first and second sacrificial regions such that the first sacrificial region is completely removed but a portion of the second sacrificial region still remains on top of the second semiconductor region.

10. The method of claim 9, wherein the first and second semiconductor regions comprise silicon.

11. The method of claim 9, wherein the insulating region comprises a nitride material.

12. The method of claim 9, wherein the first and second sacrificial regions comprise silicon dioxide.

13. The method of claim 9, further comprising after said etching the first and second sacrificial regions is performed:
forming a cap region on top of the first semiconductor region;
removing the remaining portion of the second sacrificial region.

14. The method of claim 13, further comprising after said removing the remaining portion of the second sacrificial region is performed, epitaxially growing a semiconductor material on the second semiconductor region so as to form an epi region on top of the second semiconductor region.

15. The method of claim 14, further comprising after said epitaxially growing is performed:
removing the cap region on top of the first semiconductor region such that the first semiconductor region is exposed to a surrounding ambient; and then
forming an N-channel transistor on the first semiconductor region, and a P-channel transistor on the epi region.

* * * * *